United States Patent [19]
Ing

[11] 3,943,015
[45] Mar. 9, 1976

[54] METHOD FOR HIGH TEMPERATURE SEMICONDUCTOR PROCESSING

[75] Inventor: Paul W. Ing, Poughkeepsie, N.Y.

[73] Assignee: International Business Machines Corporation, Armonk, N.Y.

[22] Filed: July 8, 1974

[21] Appl. No.: 486,555

Related U.S. Application Data

[62] Division of Ser. No. 375,190, June 29, 1973, Pat. No. 3,842,794.

[52] U.S. Cl. ................ 148/188; 148/186; 148/187
[51] Int. Cl.² .......................................... H01L 7/36
[58] Field of Search ............ 148/186, 1.5, 187, 188, 148/189; 118/49; 117/215

[56] References Cited

UNITED STATES PATENTS

| | | | |
|---|---|---|---|
| 3,571,914 | 3/1971 | Lands et al. .................... | 148/188 X |
| 3,615,942 | 12/1971 | Blumenfeld et al. ................ | 148/187 |
| 3,793,090 | 2/1974 | Barile et al. ......................... | 148/1.5 |

*Primary Examiner*—G. Ozaki
*Attorney, Agent, or Firm*—Henry Powers

[57] ABSTRACT

A method for high temperature processing in device fabrication wherein multi-processing steps are performed in the absence of subjecting the unit to ambient conditions.

6 Claims, 5 Drawing Figures

STATIC PROFILE

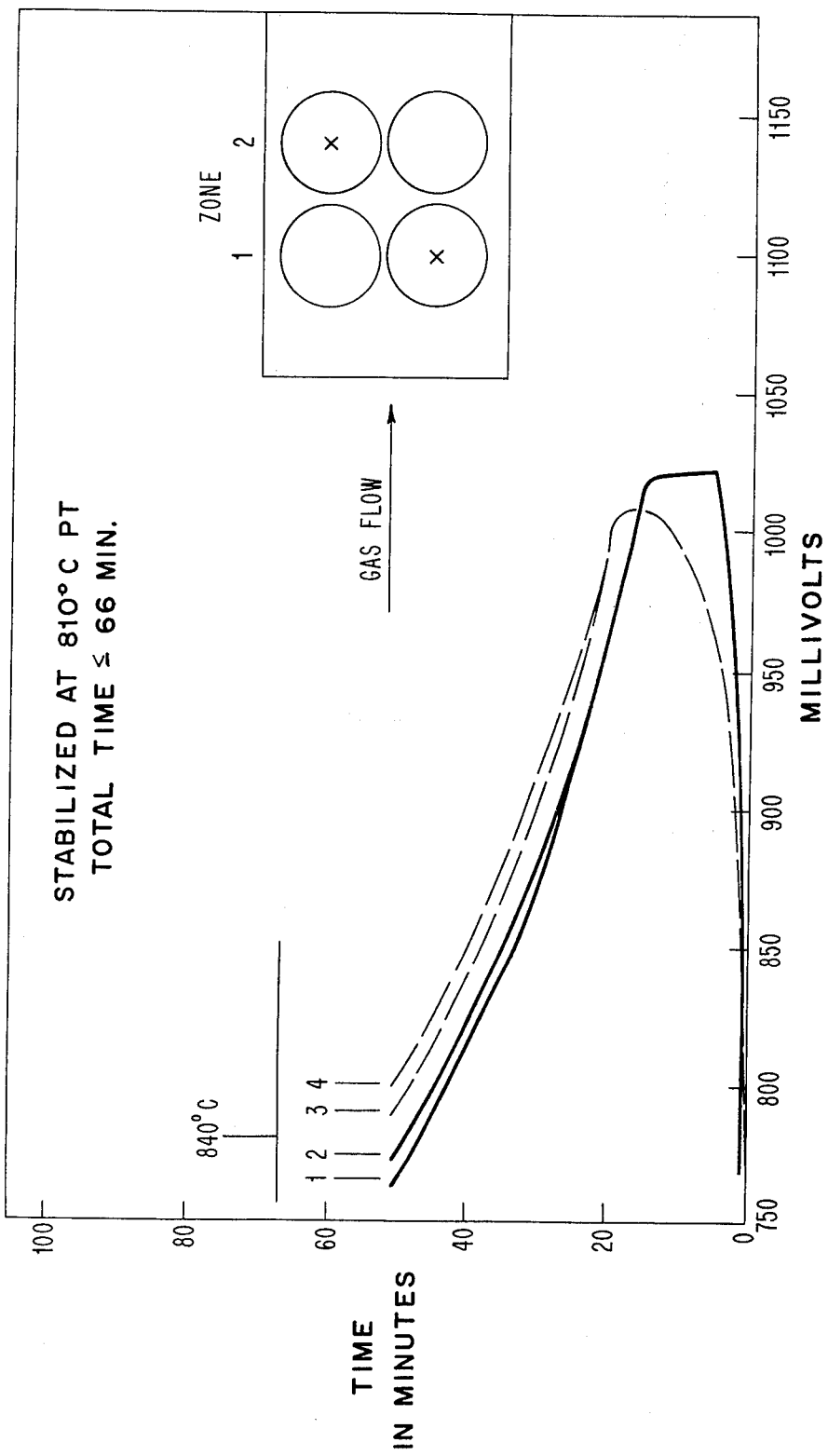

3,943,015

METHOD FOR HIGH TEMPERATURE SEMICONDUCTOR PROCESSING

This is a division of application Ser. No. 375,190 filed June 29, 1973 now U.S. Pat. No. 3,842,794.

FIELD OF THE INVENTION

This invention relates to furnaces and more particularly to an improved radiant heat furnace adapted for high temperature processing of semiconductor processing in device fabrication.

DESCRIPTION OF THE PRIOR ART

High temperature furnaces have found extensive use in the fabrication of semiconductor devices, as for example, in oxidation, diffusion, epitaxial operations and the like. Heretofore such furnaces have been compromised adaptations of those employed in other arts, and which are characterized with massive configurations, very high thermal mass and thermal inertia during heating and cooling cycles for purposes of maintaining flat thermal profiles during operations thereof. Typical furnace structures are described in U.S. Pat. Nos. 2,661,385, 2,825,222, 3,264,148, 3,299,196, 3,296,354 and 3,343,518.

SUMMARY OF THE INVENTION

Broadly speaking, the invention comprehends a furnace structure of minimized thermal mass utilizing flat parallel radiant heat diffuser plates juxtaposed in close proximity on opposite sides of coextending semiconductor wafers supported on radiant heat opaque and absorbing plate disposed within a chamber defined within a radiant heat transparent tube. The processing tube is of rectangular configuration with an optimized aspect ratio of height to width to enable an even flow of gasses across the wafers during processing cycles. In operation, the opaque radiant heat absorbing support is radiantly heated by an adjacent heater plate means while concurrently an opposite heater plate means is similarly heating the support by transmission of the radiant heat through the wafer, whereby 30 to 70 % of the heating thereof is by conduction from its support.

Accordingly, it is an object of this invention to provide a low thermal mass furnace in conjunction with fast ramp times to facilitate rapid change of temperature levels for heating and cooling of wafers without need to expose them to shock in ambient temperatures. A further object of this invention is a novel furnace characterized with flexibility to change temperatures so as to adapt the furnace to in-situ multiprocessing capabilities which normally require a plurality of conventional furnaces with attendant ambient temperature exposure on transfer of wafers between them. An additional object of this invention is to provide a novel furnace of simplified design characterized with low capital cost having provision for gas processing atmospheres and which is easy to maintain, replace and replicate. A still further object of this invention is a novel furnace adapted to process semiconductor wafers of various sizes.

The foregoing and other objects, features, and advantages of the invention will be apparent from the following more particular description of preferred embodiments of the invention as illustrated in the accompanying drawings.

BRIEF DESCRIPTION OF THE DRAWINGS

FIG. 4 is a dynamic profile of dynamic thermal characteristics of a furnace in accordance with this invention.

DESCRIPTION OF THE PREFERRED EMBODIMENTS

Figures 1, 1A:
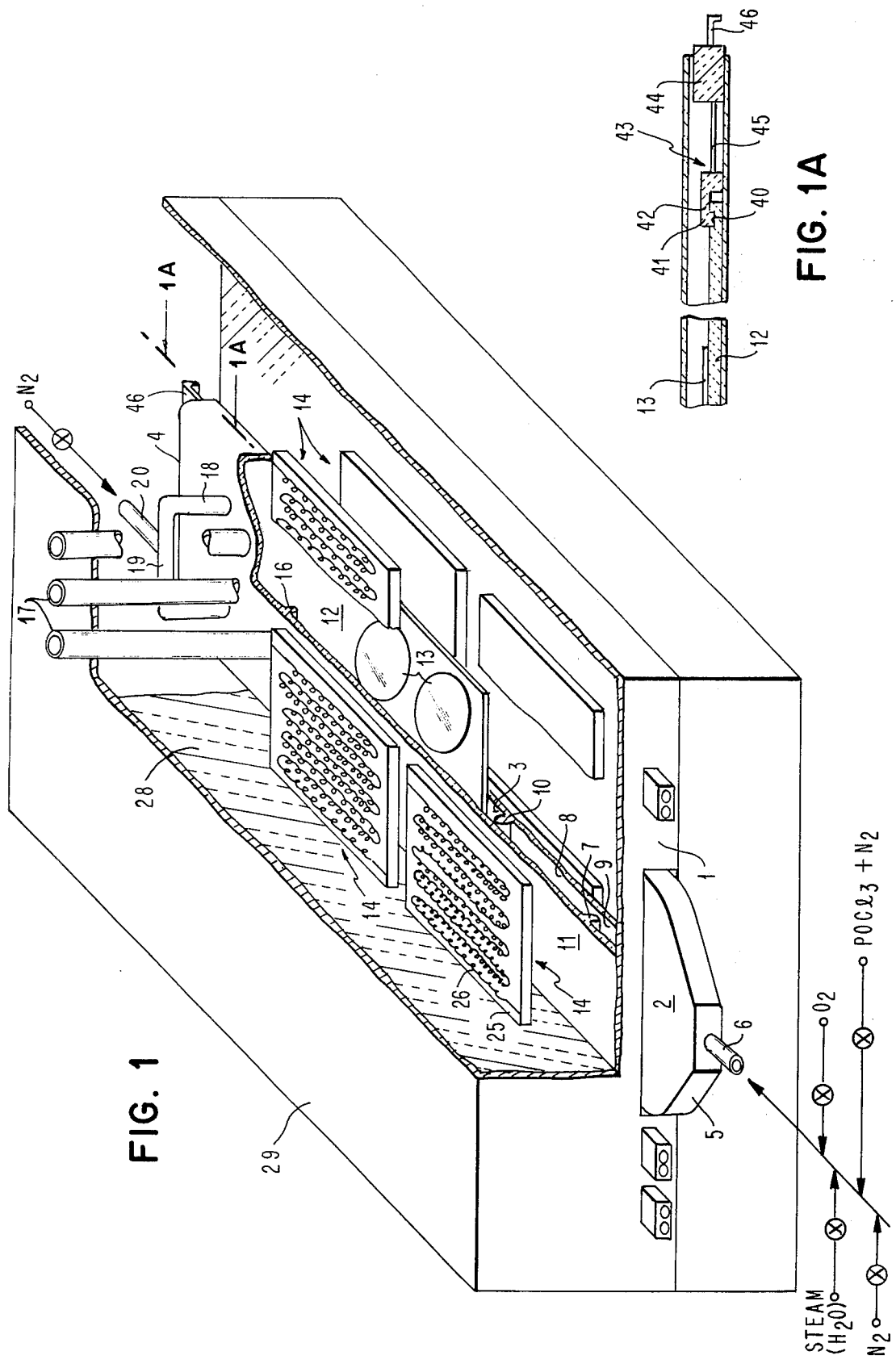
FIG. 1 is a perspective view, partly in section, of one embodiment of this invention.
FIG. 1A is an explanatory drawing of details of the embodiment of FIG. 1.

As shown in the drawings, the furnace of the invention in the basic configuration, as shown in FIG. 1, comprises a cabinet 1 through which extends a radiant heat transparent processing tube 2 as for example, a quartz tube having walls of ⅛-inch thickness, and defining within it a high temperature processing chamber 3. The tube as shown, is of rectangular cross-section having an internal width in the range of about 1.3 inches to 20 inches and an internal height in the range of about 3/16 inches to about 1 inch. In a typical application, the tube can have an internal width and height of 7.12 inches and 0.50 inches, respectively, and an overall length of 23 inches. One end 4 of tube 2 is open, and the other end 5 is tapered and provided with a gas inlet 6 connected through suitable valving to required processing gas sources. Included within tube 2, adjacent its tapered end 5, is a downwardly projecting baffle 7 extending to within a range of about 30 mils to about ¼ inch from the inner surface 8 of the tube bottom wall 9. A second baffle 10 also projects upwardly from the bottom tube wall 9 to define a gap with the inner surface of tube top wall 11 in the range of about 30 mils to about ¼ inch. In general the top wall 11 and bottom wall 9, of tube 2, extend in spaced parallel relationship to each other, with baffles 7 and 10 extending across the width of tube 2. For a specific processing application described below, each of baffles 7 and 10 defined gaps of about 55 mils with the tube walls toward which they project.

The upwardly projecting baffle 10 can function if desired as a stop of a wafer support or boat 12 which is inserted into the interior of tube 2 for positioning wafers 13 (of about 15 to 18 mils thickness) therein for processing. For purposes of this invention, the support 12 is preferably opaque to and absorbing of radiant heat supplied by a plurality of radiant heat diffuser plates 14, normally comprised of four plates units 14 juxtaposed on top of tube 2, and four plate units juxtaposed at the bottom of tube 2 (see FIG. 3). Normally, the thickness of wafer support or boat 12 will have a thickness which will position wafers 13 in parallel relationship to the tube top and bottom walls 9 and 11, respectively, and also substantially midway therebetween. Typically, the wafer boat 12 can be of quartz which is rendered opaque to radiant heat by surface roughening and will have a thickness in the range of about 1/16 inch to about ¼ inch. For a specific furnace design the boat 12 was provided with a thickness of about 0.125 inches.

Boat or support 12 is also formed, as shown in the detailed drawing of FIG. 1A, with a groove 40 for operative engagement with a lip 41 from a front portion 42 of a boat handler or pusher unit 43 employed for inserting and withdrawing support 12 into and from the processing tube 2. Front portion 42 is attached by tie rods 45 to a rear plug portion 44 which is received in the tube to restrict exit of processing gasses out of the processing tube 2. Handling of the pusher unit 43 is facilitated by means of a handle 46 formed on the exposed face of the plug unit 44. In general the plug unit 44 is dimensioned to provide about a 30 to 60 mil clearance with the inner surfaces of processing tube 2. Also, all components of the pusher unit 43 can be fabricated of quartz.

Critical for purposes of this invention, is the resultant spacing (S) between the inner surface of tube top wall 11 and the top surface of wafers 13 at which they are positioned by support or boat 12. The ratio of such spacing to the inner width (W) of tube 2 defines a critical aspect ratio (W/S) which in conjunction with baffles 7 and 10 control gas in even flow in distribution through the processing length of tube 2 and across the top surfaces of wafer 13 without any dead or stagnant flow areas. In general, the height of or spacing between the inner surface of tube top wall 11 and the wafers will be in the general range of about ⅛ inch to about ¾ inch, and it is necessary that this spacing (S) conform to aspect ratio W/S relative to the internal width (W) of the tube 2. In general, the aspect ratio W/S can be in the range of about 7 to about 30, and optimally about 18.

Also included within tubes 2 is a throttle baffle 16 projecting downwardly from the tube top wall 11 to restrict gas flows toward outlet tubes 17 through which they are exhausted from tube 2 with assist from back pressure generated by injection of an inert gas through inlet ports 18 from a common manifold 19 fed from the gas inlet tube 20.

The radiant heat diffuser plate means 14 is formed of electrically insulating material characterized with a relatively high thermal conductivity in the ranging about 0.3 to about 4 (Btu/Hr-Ft-°F) typical of which is aluminum oxide ($Al_2O_3$) of relatively high purity, mullite with approximately 25 up to 96% $Al_2O_3$, and the like. The back sides of diffuser plate means 14, are formed with mounting grooves 25 through which are threaded a helical resistance element 26 for generating the primary heating energy for radiant heat diffusion by the secondary heater plate means 14. Control of heat generation is obtained by means of conventional thermocouples which extend into the furnace with the exposed sensing bead (not shown) disposed between the heater plate means 14 and the reactor tube 2 opposite wafers 13, as shown.

Surrounding the heater units and reactor tube 2 is any suitable insulating material 28 having a mass of about 15 to about 34 pounds and a thermal conductivity in the range of about 0.08 to about 0.11 (Btu/Hr-Ft-°F) enclosed within a casing 29 for packaging of the furnace. A particularly advantageous insulating material is fibrous aluminum silicate (available from the Eagle-Picher Co. of Cincinnati, Ohio) which is lightweight, dimensionally stable and very efficient and having one-half of the thermal conductivity of firebrick at 1000°C. Another advantage of this ceramic fibrous material is that it is available in blocks which can be suitably shaped about its enclosed contents.

Figure 2:
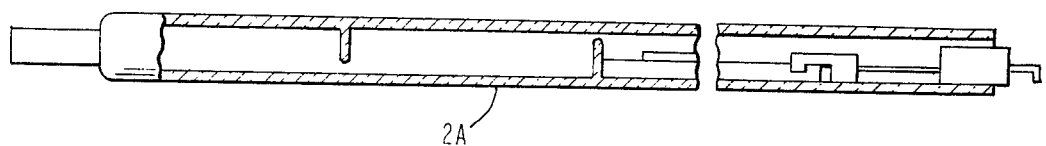
FIG. 2 is a perspective view, partly in section of a modified reactor tube employed in this invention.

FIG. 2 illustrates another embodiment of the invention utilizing a modified reactor tube 2A which can be employed with processing gasses compatible with ambient atmospheres (e.g., oxygen). In the modification, the exhaust ports 17 are omitted as well as the backflow gas entry inlet 20 and ports 18. In use the gas is discharged into the atmosphere from the loading end of reactor tube 2A. In all other aspects, reactor tube 2A has substantially the same configuration as reactor tube 2 required for purposes of this invention.

Figure 3:
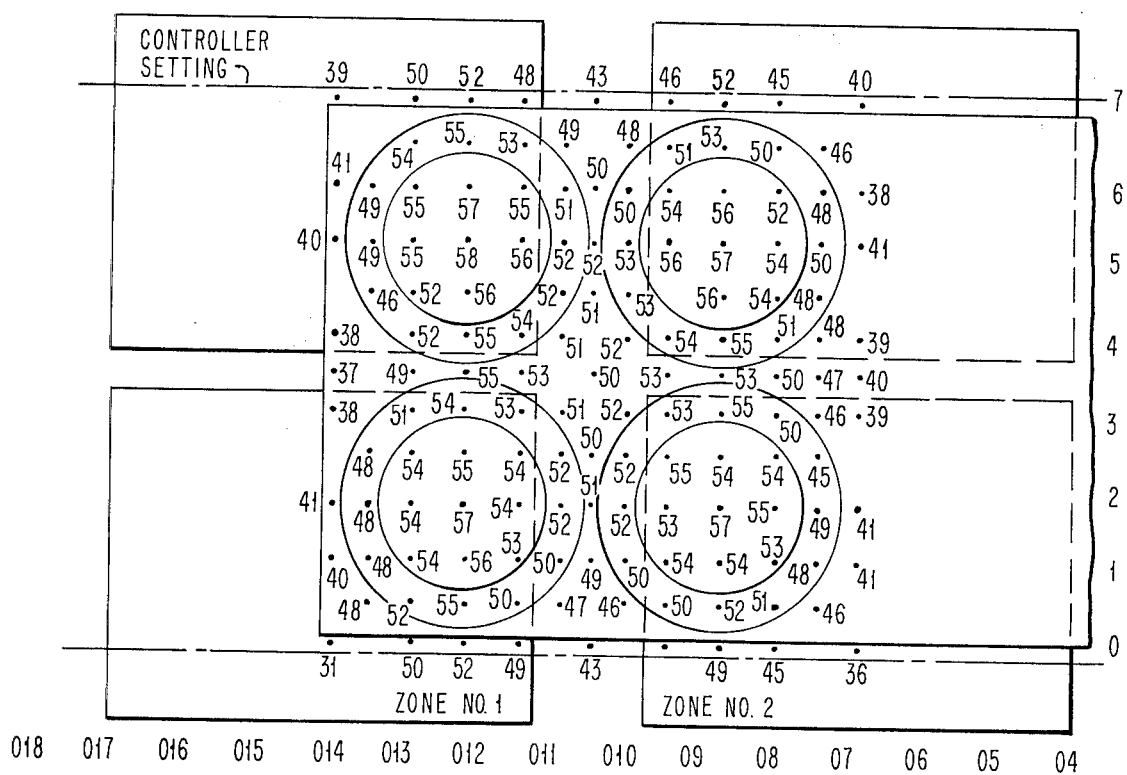
FIG. 3 is a static profile of the thermal characteristics of a furnace in accordance with this invention.

FIG. 3 is a static profile map of the thermal characteristics of a furnace in accordance with this invention (e.g., FIG. 1) with gas flowing through the reactor tube 2 at rates noted below in one example of processing silicon semiconductor wafers. The thermocouples employed had exposed beads directly over the wafer boat 12 about 1/16 inch from contact, and with at least 2 minute stabilization times used between readings. Also thermal mapping is in terms of temperature at points in contrast to large areas as conventionally employed with $N_2$ enclosed thermocouple probes. The readings in the table below are called out in millivolts after the unit number which is nine, so that a number $x$ (e.g., 55) on the map is actually $9.x$ (e.g., 9.55) millivolts (e.g., 9.55 = 99.7°C).

TABLE

| MV | | °C |
|---|---|---|
| 9.30 | = | 976 |
| 9.40 | = | 984 |
| 9.50 | = | 993 |
| 9.56 | = | 998 |
| 9.57 | = | 999 |
| 9.585 | = | 1000 |
| 9.596 | = | 1001 |

FIG. 4 is a chart of the dynamic profile representing a 840° to 1050°C temperature ramp of a furnace (e.g., FIG. 1) in accordance with this invention, with cool down back to 840°C. With this processing cycles of ≤ 66 minutes are feasible with temperature changes of 840°C → 1050°C → 840°C.

Curves 1 and 2 are outputs from the control thermocouples embedded in the heater elements at the respective zones shown in the drawing. (Alternatively, control thermocouple may be located between heater plate and process tube.) Curves 3 and 4 are outputs from thermocouples resting directly over the center of two wafer positions on the process boat, as for the static profile above. Curve 3 is taken in zone 1 and curve 4 taken in zone 2. As can be seen, in both zones, the heater elements and wafer position tracked substantially identically.

The following illustrates the application of the furnaces of this invention to the formation of gate oxides for FETs having source and drain regions previously formed therein by earlier operations. For this operation two furnaces of this invention are employed; the first utilizing a reactor tube 2A of FIG. 2, and the second utilizing the reactor tube 2 described in reference to FIG. 1.

In operation silicon substrates 13 with gate openings (defined in a base silicon oxide layer by photolithographic techniques) are placed on boat 12 and inserted into the first furnace heated to 1000°C for a process cycle time of about 72 minutes with dry oxygen flowing through the reactor tube 2A at a rate of 1300 cc./mm. (As will be understood, this oxidation stage can be conventionally carried out in a temperature range of about 900°to about 1200°C). In this step, a dry gate silicon oxide is grown on the wafer 13, after which the boat 12 is transferred immediately to a second furnace, illustratively at a temperature of 840°C of an operative range of about 800°C to about 900°C where for a 2–5 minute stabilization period 1182 cc/min of nitrogen and 118 cc/min of oxygen is passed through the reactor tube 2 (e.g., FIG. 1) by injection through feed nozzle 6 in conjunction with a back flow of 945 cc/min of nitrogen injection through back-flow ports 18.

At the end of the 2 to 5 minute stabilization period, a dopant gas is then also added into reactor tube 2 (via inlet nozzle 6) which was comprised of 15 cc/min of nitrogen containing 440 ppm of $POCl_3$ for 5 to 7 minutes to deposit a phosphosilicate glass (PSG) on the substrate at the 840°C temperature. At the end of the PSG deposition the $POCl_3$ doped nitrogen gas was valved-off, and the furnace temperature was ramped to 1050°C over a 15 minute anneal period to stabilize surface charges and distribute the phosphorous impurities through the silicon oxide coating on the substrate. The specific annealing temperature indicated is illustrative of an operative range of about 900° to about 1200°C. At the end of the anneal cycle, the furnace was ramped down to 840°C. Meanwhile, the boat was withdrawn for cooling of wafers in the ambient. The resultant $SiO_2$ and PSG combined thickness was substantially 675 Angstroms with a PSG thickness of 110 Angstroms.

It is noted that although the cool-down of the furnace was obtained solely by control of energy input and heat loss of the furnace, such cool-down may be assisted by blowing of cooling gasses through the furnace by injection of such gasses between the reactor tube (externally) and the heater plate means.

While the invention has been particularly shown and described with reference to particular embodiments thereof, it will be understood by those skilled in the art that the foregoing and other changes in form and details may be made therein without departing from the spirit and scope of the invention.

What is claimed is:

1. In processing a monocrystalline silicon substrate, the steps comprising:
   A. oxidizing a surface portion of said substrate in an oxidizing atmosphere at a first elevated temperature in the range of about 900°C to about 1200°C;
   B. transferring the wafer of Step A at said first elevated temperature to a heated second atmosphere of oxygen and an inert diluent gas and thermally stabilizing said substrate therein at a second temperature in the range of about 800° to about 900°C;
   C. establishing a third processing atmosphere by introducing a conductivity determining impurity into said second atmosphere and forming therein a said impurity doped oxide over said surface portion of said substrate at said second temperature;
   D. reforming said third atmosphere to said second atmosphere of oxygen and a diluent inert gas at said second temperature with said substrate disposed therein,
   E. heating said substrate in said reformed second atmosphere to a third temperature in the range of about 900° to about 1200°C;
   E. annealing said substrate at said third temperature in said reformed second atmosphere to remove fast surface states in said substrate from said doped oxide into said substrate;
   G. removing said substrate from said reformed second atmosphere for cooling to ambient temperatures; and
   H. cooling the process tube in said reformed second atmosphere from said third temperature to a fourth temperature in the range from about 800° to about 900°C.

2. The process of claim 1 wherein said Step A is performed in a first processing chamber and said Steps B to G are performed in a second processing chamber.

3. The process of claim 2 wherein said first and second processing chambers are defined within first and second quartz tube portions.

4. In processing a silicon substrate, the steps comprising:
   A. heating a silicon monocrystalline substrate having an exposed silicon oxide film on a surface portion, to a temperature in the range of about 800° to about 900°C in a first processing atmosphere comprised of oxygen, a diluent inert gas and a conductivity determining impurity, and forming a doped oxide over said oxide film;
   B. converting said first atmosphere to a second processing atmosphere comprised of oxygen and a diluent inert gas with said substrate disposed therein;
   C. heating said substrate in said second atmosphere to a second temperature in the range of about 900° to about 1200°C;
   D. annealing said substrate in said second atmosphere at said second temperature to remove fast surface states in said substrate; and
   E. cooling said substrate to ambient temperatures.

5. The process of claim 4 wherein said Steps A to D are performed in a single chamber.

6. The process of claim 5 wherein said chamber is defined within a quartz tube.

* * * * *